(12) United States Patent
Poiret et al.

(10) Patent No.: US 9,958,030 B2
(45) Date of Patent: May 1, 2018

(54) CHAIN ELEMENT, CHAIN PIN, AND METHOD FOR PRODUCING SAME

(71) Applicant: Schaeffler Technologies AG & Co. KG, Herzogenaurach (DE)

(72) Inventors: Christian Poiret, Coulogne (FR); Monir Asgarpour, Calais (FR)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 483 days.

(21) Appl. No.: 14/429,152

(22) PCT Filed: May 24, 2013

(86) PCT No.: PCT/EP2013/060711
§ 371 (c)(1),
(2) Date: Mar. 18, 2015

(87) PCT Pub. No.: WO2014/044418
PCT Pub. Date: Mar. 27, 2014

(65) Prior Publication Data
US 2015/0233447 A1     Aug. 20, 2015

(30) Foreign Application Priority Data
Sep. 21, 2012   (DE) .................. 10 2012 217 020

(51) Int. Cl.
*F16G 13/06*     (2006.01)
*C23C 16/06*     (2006.01)
*C23C 16/44*     (2006.01)
*C23C 16/56*     (2006.01)

(52) U.S. Cl.
CPC .............. *F16G 13/06* (2013.01); *C23C 16/06* (2013.01); *C23C 16/44* (2013.01); *C23C 16/56* (2013.01)

(58) Field of Classification Search
CPC ......... C23C 16/06; C23C 16/44; C23C 16/56; F16G 13/06
USPC ........................................................ 148/516
See application file for complete search history.

(56) References Cited

U.S. PATENT DOCUMENTS

| 3,136,664 A | 6/1964 | Kuntzmann |
| 3,824,134 A | 7/1974 | Chance |
| 7,345,255 B2 | 3/2008 | Jiang et al. |
| 2011/0308227 A1 | 12/2011 | Hahn et al. |

FOREIGN PATENT DOCUMENTS

| CN | 101111624 | 1/2008 |
| DE | 102009008480 | 8/2010 |
| EP | 1970596 | 9/2008 |
| GB | 909239 | 7/1960 |

Primary Examiner — Jie Yang
(74) Attorney, Agent, or Firm — Volpe and Koenig, P.C.

(57) ABSTRACT

Chain element (2), particularly a chain pin (4) for joining at least two chain links (3), which element is formed from a base material (5) containing carbon, particularly steel, characterized in that it has a surface layer (7) containing boron and vanadium, wherein the surface layer (7) is produced by a method according to which, in a first method step, an intermediate layer (6) containing carbon and vanadium is formed by at least one measure for the diffusion of vanadium into surface regions close to the surface of the base material (5) and, in a subsequent second method step, the surface layer (7) is formed by the transformation of the intermediate layer (6) by at least one measure for the diffusion of boron into the intermediate layer (6).

7 Claims, 2 Drawing Sheets

CHAIN ELEMENT, CHAIN PIN, AND METHOD FOR PRODUCING SAME

FIELD OF THE INVENTION

The present application relates to a chain element that is formed from a substrate material, in particular, steel, containing carbon and is constructed as a chain or as part of such a chain, e.g., as a chain pin, which is used, in particular, in chain drives. The application also relates to a method for the production of such a chain element or part.

BACKGROUND

Chain elements according to the class are used, e.g., as chain drives or parts of corresponding chain drives for transmitting forces and are used in a number of different fields of technology, for example, in the field of automotive engineering.

Chain elements are typically formed from steels that can receive particularly large mechanical loads due to the high mechanical loads that prevail during operation. It is further known to provide chain elements, especially in areas contacting other chain elements or other components, with a surface modification that influences the mechanical properties, in particular, surface hardening, which is to be understood as a wear-resistant coating that is stable with respect to corrosive media. A corresponding surface modification, that is, in particular, the formation of a special surface layer, can be used, for example, to impart a changed property spectrum to the substrate material forming the chain element in the area of its surface. For example, a material, especially a steel, can be provided with a certain strength and tenacity with an especially wear-resistant and corrosion-stable surface layer and in this way can be changed in a targeted manner in its mechanical properties. Known methods for modifying the surface of steels, that is, for forming corresponding surface layers, are, for example, case hardening (carbonization), nitriding, and/or the application of coatings based on titanium or molybdenum.

However, the surface layers formed by corresponding processes are not satisfactory or only conditionally satisfactory with regard to the particularly wear-intensive and optionally also corrosive conditions in the field of application of corresponding chain elements that are produced, e.g., by contamination with lubricants or lubricant residues or combustion residues of internal combustion engines, for the later application.

SUMMARY

The invention is based on the objective of providing a chain element that is improved, in particular, with regard to wear resistance and corrosion resistance.

To meet this objective, for a chain element of the type named above, it is provided according to the invention that it has a surface layer that contains boron and vanadium, wherein the surface layer is produced by means of a method, wherein, in a first processing step, an intermediate layer is formed that contains carbon and vanadium and is formed by at least one measure for the diffusion of vanadium into areas of the substrate material close to the surface and in a subsequent second processing step, the surface layer is formed by the conversion of the intermediate layer by at least one measure for the diffusion of boron into the intermediate layer.

The intermediate layer is thus formed by at least one measure for the diffusion of vanadium into areas of the substrate material forming the chain element close to the surface, that is, in particular, of the steel forming the chain element, and contains essentially carbon and vanadium, that is, in particular, carbon-vanadium compounds, e.g., vanadium carbide (VC). The surface layer is subsequently formed by at least one measure for the diffusion of boron into the previously formed intermediate layer, wherein the intermediate layer is converted completely into the surface layer, and contains essentially boron and vanadium, that is, in particular, boron-vanadium compounds, e.g., vanadium boride ($VB_2$). Consequently, the intermediate layer exists only temporarily and is no longer present after the surface layer is formed by the complete conversion of the intermediate layer.

The surface layer of the chain element according to the invention formed by the conversion of the intermediate layer is directly adjacent to the substrate material forming the chain element or formed at least partially from this chain element. Consequently, the surface layer forms, in particular, the exposed surface of the chain element according to the invention.

The chain element according to the invention has an improved characteristics profile due to the surface layer. In particular, due to the formation of the surface layer, the chain element according to the invention has wear resistance, overrun resistance, etc., both with regard to its mechanical properties, in particular, surface hardness, wherein regularly sufficient ductility is further guaranteed, and also has corrosion resistance relative to corrosive media, that is, in particular, the lubricants named above, in particular, degraded lubricating oils or lubricating greases, and has an excellent characteristics profile.

Consequently, the chain element according to the invention can be used, e.g., without any additional means, in the regularly mechanically and also corrosively high load operating conditions as part of the drive train of modern motor vehicles, where it is distinguished by its improved service life in comparison with conventional chain elements. This is based, in particular, on the previously mentioned high wear resistance with respect to the abrasive particles produced during the operation of the motor vehicle and also originating from components of the drive train due to wear and also the increased corrosion resistance relative to the corrosive environment caused by degraded lubricating agents around the surface layer of the chain element according to the invention.

The construction of both the intermediate layer and also the surface layer preferably has no effect or only a slight effect on the properties of the material containing carbon or the substrate material forming the chain element according to the invention, or its basic structure, wherein this substrate material usually involves a steel, e.g., SAE 1010, SAE 1012, SAE 8620, DIN 16MnCr5. The substrate material is preferably a material, i.e., in particular, a steel with a carbon content of approx. 0.8 wt. %. The substrate material forming the chain element could also be formed, for example, from steels of type CK75 or 100Cr6.

The surface layer can be theoretically separated from the other material of the chain element such that this layer has a higher percentage of vanadium and boron or vanadium-boron compounds, e.g., $VB_2$, in comparison with the substrate material forming the chain element, which can be shown, e.g., using polished micrograph sections.

What is to be understood according to the invention as an area of the chain element that is close to the surface can be similarly explained, namely that area of the chain element in which the surface layer containing, in particular, boron and vanadium or vanadium-boron compounds, e.g., $VB_2$, is formed.

The intermediate layer is formed according to the invention by at least one measure for the diffusion of vanadium in areas of the substrate material of the chain element that are close to the surface. Consequently, as a function of the actually selected and used process parameters, e.g., temperature, pressure, duration, etc., in the scope of the measure for the diffusion of vanadium into areas of the substrate material of the chain element that are close to the surface, a specific effect can be realized on the intermediate layer that is to be formed or is already formed and that contains carbon and vanadium. In particular, the penetration depth of the vanadium atoms or vanadium compounds, as well as the concentration of the vanadium atoms and vanadium compounds, in particular, carbon-vanadium compounds with different compositions, in the intermediate layer can be influenced or controlled in a process-specific way.

The same applies to the following construction of the surface layer, that is, depending on the processing parameters, e.g., temperature, pressure, duration, etc., actually selected or used in the scope of the measure for the diffusion of boron into the intermediate layer, the surface layer containing boron and vanadium or vanadium-boron compounds to be formed or already formed can be selectively influenced. In particular, the penetration depth of the boron atoms or boron compounds and the concentration of the boron atoms or boron compounds can be influenced or controlled depending on the process like, in particular, the vanadium-boron compounds with possibly different compounds in the surface layer during the construction of the surface layer by the conversion of the intermediate layer.

As is still to be explained below, both the intermediate layer and also the surface layer can each be formed, in particular, by means of thermochemical methods for the diffusion of vanadium, that is, vanadium atoms and/or vanadium compounds, into the substrate material of the chain element in the scope of the formation of the intermediate layer or measures for the diffusion of boron, that is, boron atoms and/or boron compounds, into the intermediate layer in the scope of the formation of the surface layer or the conversion of the intermediate layer.

The at least one measure for the diffusion of vanadium into areas of the substrate material of the chain element close to the surface for the formation of the intermediate layer advantageously here comprises an especially thermochemical vanadizing process of the substrate material of the chain element. The at least one measure for the diffusion of boron into the intermediate layer for the conversion of the intermediate layer, i.e., for the formation of the surface layer, advantageously comprises an especially thermochemical borizing of the intermediate layer.

The surface layer has, e.g., a hardness of 1000-3000 HV (Vickers hardness), in particular, greater than 1500 HV. The high hardness of the surface layer makes a considerable contribution to the improved wear resistance of the chain element according to the invention. Obviously, the surface layer can also be below 1000 HV or above 3500 HV in exceptional cases.

The surface layer has, for example, a layer thickness of 1 to 25 µm, preferably from 5 to 20 µm. As mentioned, the layer thickness of the surface layer can be influenced, in particular, by selecting and adjusting the process parameters used in the scope of forming the surface layer. The same applies to the intermediate layer, which can be converted into the surface layer. Consequently, it is basically also possible that the intermediate layer could have a greater layer thickness than the subsequently formed surface layer, or vice versa, depending on the processing parameters used in the scope of each measure for the formation of the intermediate layer and the surface layer. Obviously, the layer thickness of the surface layer containing boron and vanadium can also be below 1 µm or above 25 µm.

The chain element according to the invention is, in particular, a chain pin for connecting at least two chain links of a chain. Chain pins are usually highly loaded components of a chain, so that the formation according to the invention of a surface layer containing boron and vanadium is especially preferred, wherein an intermediate layer containing carbon and vanadium produced by at least one measure for the diffusion of vanadium into areas of the substrate material close to the surface is formed in a first processing step and the surface layer is formed in a subsequent second processing step by the conversion of the intermediate layer by at least one measure for the diffusion of boron into the intermediate layer.

In principle, all of the designs for the chain element according to the invention apply analogously to the chain pin according to the invention.

In addition, the invention relates to a method for producing a chain element formed from a substrate material, in particular, steel, containing carbon, in particular, a chain pin for connecting at least two chain links, with a surface layer containing boron and vanadium. The method comprises the processing steps of preparing a chain element formed from a substrate material, in particular, steel, containing carbon, performing at least one measure for the diffusion of vanadium into areas of the substrate material that are close to the surface for forming an intermediate layer containing carbon and vanadium, and subsequently performing at least one measure for the diffusion of boron into the intermediate layer, so that the intermediate layer is converted into the surface layer under the formation of the surface layer containing boron and vanadium.

The processing step of performing the at least one measure for the diffusion of vanadium into areas of the substrate material close to the surface for the construction of an intermediate layer containing carbon and vanadium can be considered a first processing step for the construction of the chain element. The processing step of performing the at least one measure for the diffusion of boron into the intermediate layer, so that the intermediate layer is converted into the surface layer under the formation of the surface layer containing boron and vanadium, can be considered as the second processing step for the construction of the chain element.

Here, preferably an especially thermochemical vanadizing process of the substrate material is performed as the at least one measure for the diffusion of vanadium into areas of the substrate material of the chain element that are close to the surface for forming the intermediate layer containing carbon and vanadium. Preferably an especially thermochemical borizing process is performed as at least one measure for the diffusion of boron into the intermediate layer during the conversion of the intermediate layer for forming the surface layer containing boron and vanadium.

In the scope of the thermochemical vanadizing of the substrate material of the chain element preferably provided for forming the intermediate layer, a powder containing vanadium or a paste containing vanadium is applied onto the substrate material of the chain element, wherein vanadium diffuses out of the powder or the paste into the substrate material of the chain element under the influence of temperature.

Starting from an example powder mixture that contains vanadium and comprises Fe—V, $Al_2O_3$, $NH_4Cl$, the chemical reactions according to formulas (1)-(4) can take place for forming the intermediate layer at temperatures of, e.g., 950-1250° C.

$$NH_4Cl \leftrightarrow NH_{3(g)}+HCl_{(g)} \quad (1)$$

$$V+2HCl_{(g)} \leftrightarrow VCl_2+H_{2(g)} \quad (2)$$

$$V+3HCl_{(g)} \leftrightarrow VCl_3+1.5H_{2(g)} \quad (3)$$

$$2VCl_3 \leftrightarrow VCl_2+VCl_{4(g)} \quad (4)$$

With a further increase in the temperature, the especially gaseous vanadium-chloride compounds formed according to formula (4) can react chemically with the substrate material, that is, steel, and then with an iron compound of the chain element according to formulas (5) and (6), wherein the intermediate layer containing essentially vanadium carbide (VC) is formed.

$$VCl_{4(g)}+2Fe \leftrightarrow V+2FeCl_{2(g)} \quad (5)$$

$$VCl_{3(g)}+1.5Fe \leftrightarrow V+1.5FeCl_{2(g)} \quad (6)$$

$$V+C \leftrightarrow VC \quad (7)$$

Consequently, the chemical processes shown in formulas (1) to (7) are all part of the vanadizing process of the substrate material of the chain element for forming the intermediate layer, wherein, at the end, there are essentially carbon-vanadium compounds, e.g., vanadium carbide (VC).

At the comparatively reduced temperatures in the range of approx. 950-1000° C., the borizing of the chain element can also take place, that is, of the previously formed intermediate layer. Likewise, starting from a powder that contains boron or boron compounds and is deposited on the intermediate layer, a diffusion of boron into the intermediate layer takes place in which it interacts with the carbon-vanadium compounds present there, that is, in particular, vanadium carbide (VC) or reacts, in particular, according to formula (8), wherein the intermediate layer is converted completely into the surface layer, wherein the surface layer is formed.

$$VC+B \leftrightarrow B_2+C \quad (8)$$

The surface layer then has, in particular, vanadium boride ($VB_2$) as a boron-vanadium compound. Iron-boride compounds are not formed or only in small amounts, if at all.

The at least one measure for the diffusion of vanadium into areas of the substrate material close to the surface for forming the intermediate layer containing carbon and vanadium can be performed in a temperature range of 900-1300° C., in particular, 950-1250° C. The at least one measure for the diffusion of boron into the intermediate layer for forming the surface layer containing boron and vanadium can be performed in a temperature range of 800-1100° C., in particular, 950-1000° C. The temperature during the performance of the at least one measure for the diffusion of vanadium into areas of the substrate material close to the surface for forming the intermediate layer or during the performance of the at least one measure for the diffusion of boron into the intermediate layer for converting the intermediate layer or for forming the surface layer containing boron and vanadium can affect, depending on the process, the properties, e.g., hardness, penetration depth, homogeneity, etc., both for the intermediate layer and also the subsequently formed surface layer. Obviously, temperatures below or above the specified temperatures or temperatures ranges could be used in exceptional cases.

It is possible that the at least one measure for the diffusion of vanadium into areas of the substrate material close to the surface for forming the intermediate layer containing carbon and vanadium and the at least one measure for the diffusion of boron into the intermediate layer for forming the surface layer containing boron and vanadium are each performed for a duration of 1-24 hours, in particular, 2-8 hours. The duration of each measure both for forming the intermediate layer and also the subsequently formed surface layer, that is, in particular, the specific duration for the thermochemical vanadizing process of the substrate material of the chain element and the duration for the subsequent thermochemical borizing process of the intermediate layer can affect, depending on the process, the properties such as, e.g., hardness, penetration depth, homogeneity, etc., of the intermediate layer. Obviously, the measures for forming the intermediate layer and/or the surface layer could also be shorter or longer than the specified times in exceptional cases.

The measures for forming the surface layer are advantageously performed such that the surface layer has a layer thickness in the range of 1 to 25 µm. In particular, the measures for forming the intermediate layer and also of the subsequently formed surface layer can be constructed such that the intermediate layer has a layer thickness of 1 to 25 µm, preferably 1 to 5 µm, and the subsequently formed surface layer has a layer thickness of 1-25 µm, preferably 5 to 20 µm, or vice versa.

In principle, all of the configurations for the method according to the invention for producing a chain element formed from a substrate material, in particular, steel, containing carbon, in particular, a chain pin for connecting at least two chain links, with a surface layer containing boron and vanadium apply analogously to the chain element according to the invention and also to the chain pin according to the invention.

BRIEF DESCRIPTION OF THE DRAWINGS

One embodiment of the invention is shown in the drawing and will be described in more detail below. Shown are.

DETAILED DESCRIPTION OF THE PREFERRED EMBODIMENTS

Figure 1:
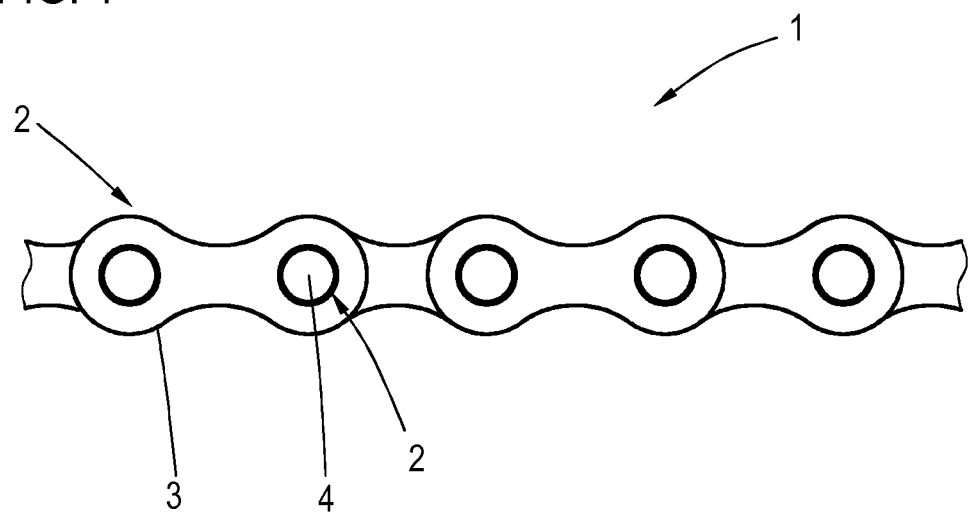
FIG. 1 a characteristic section of a chain comprising multiple chain elements.

FIG. 1 shows a characteristic cutout of a chain 1 comprising multiple chain elements 2. The chain 1 can be constructed as a toothed chain and used, for example, for transmitting force in the drive train or as part of the drive train of a motor vehicle.

Figure 2:
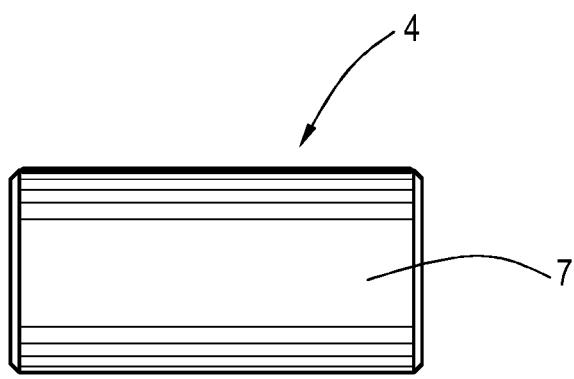
FIG. 2 a chain element in the form of a chain pin for connecting at least two chain links of a chain, and FIGS. 3-6 the essential processing steps during the production of a chain element.

Clearly the chain 1 comprises multiple chain elements 2 in the form of chain links 3, in particular, clip-shaped links, which are arranged one after the other and are connected to each other by chain pins 4. FIG. 2 shows a separate representation of a chain element 2 in the form of a chain pin 4 for connecting at least two chain links 3 of a chain 1.

The chain elements 2 forming the chain 1, that is, the chain links 3 and the chain pins 4, are formed from a metallic substrate material 5, in particular, a steel, e.g., CK75, based on carbon and iron. The chain elements 2 have been subjected to two different thermochemical surface treatments.

Figure 3:
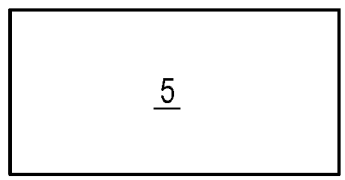
Figure 4:
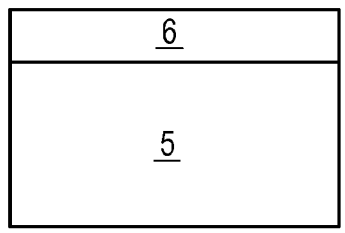

After the preparation (see FIG. 3) of a chain element 2 formed from a substrate material 5, i.e., a steel, e.g., CK75, containing carbon and iron, as a first step a measure for the diffusion of vanadium into the substrate material 5 of the chain element 2 is performed, wherein an intermediate layer 6 directly adjacent to the substrate material 5 is formed that contains essentially carbon and vanadium or carbon-vanadium compounds, in particular, vanadium carbide (VC) (see FIG. 4).

Figure 5:
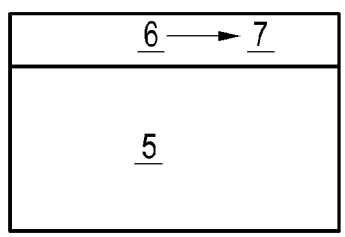
Figure 6:
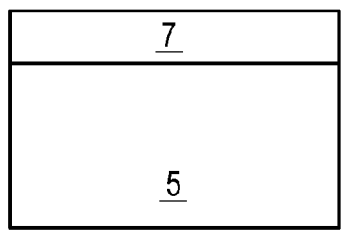

Then a measure for the diffusion of boron into the intermediate layer 6 is performed, wherein the intermediate layer 6 is converted completely into a surface layer 7 (see FIG. 5), i.e., a surface layer 7 is formed that contains essentially boron and vanadium or boron-vanadium compounds, in particular, vanadium boride ($VB_2$) (see FIG. 6).

Consequently, the intermediate layer 6 exists only temporarily and is no longer present after the surface layer 7 is formed by the complete conversion of the intermediate layer 6.

The surface layer 7 can be considered as the outer surface of the chain element 2.

Specifically, as a measure for the construction of the intermediate layer 6, a thermochemical vanadizing process of the chain element 2 is performed, in which vanadium atoms or vanadium compounds diffuse into the substrate material 5 of the chain element 2 from a powder containing vanadium or vanadium compounds applied onto the chain element 2 or a paste containing vanadium or vanadium compounds at elevated temperatures in the range of 950-1250° C., wherein this process forms the intermediate layer 6.

As the subsequently performed measure for converting the intermediate layer 6 or for forming the surface layer 7, a thermochemical borizing process of the intermediate layer 6 is performed, in which boron atoms or boron compounds diffuse into the intermediate layer 6 containing essentially vanadium-carbon compounds, such as vanadium carbide, from a powder containing boron or boron compounds applied on the intermediate layer 6 or a paste containing boron or boron compounds at elevated temperatures in the range of 950-1000° C., wherein this process converts the intermediate layer 6 into the surface layer 7 and forms the surface layer 7.

The processing duration for performing the vanadizing process or the subsequent borizing process can equal, e.g., overall, 6 hours.

The formed surface layer 7 has, e.g., a thickness of approx. 20 µm.

The hardness of the surface layer 7 is approx. 2500 HV (Vickers hardness).

The surface layer 7 imparts an improved characteristics profile to the chain element 2, wherein, in particular, the wear resistance and also the corrosion resistance are improved due to the high hardness in the range of approx. 2500 HV of the surface layer 7.

The production of a chain element 2, in particular, of a chain pin 4 for connecting at least two chain links 3, with a surface layer 7 containing boron and vanadium is performed by a method with the steps of preparing a chain element 2 (see FIG. 3) formed from a substrate material 5, in particular, steel, containing carbon, performing at least one measure for the diffusion of vanadium into areas of the substrate material 5 close to the surface for forming an intermediate layer 6 (see FIG. 4) containing carbon and vanadium, and subsequently performing at least one measure for the diffusion of boron into the intermediate layer 6, so that the intermediate layer 6 is converted into the surface layer 7 (see FIGS. 5, 6) under the formation of the surface layer 7 containing boron and vanadium.

As mentioned, as a measure for the diffusion of vanadium into areas of the substrate material 5 of the chain element 2 close to the surface for forming the intermediate layer 6 containing carbon and vanadium, preferably a thermochemical vanadizing process of the substrate material 5 is performed and as a measure for the diffusion of boron into the intermediate layer 6 for forming the surface layer 7 containing boron and vanadium, preferably a thermochemical borizing process of the intermediate layer 6 is performed.

LIST OF REFERENCE NUMBERS

1 Chain
2 Chain element
3 Chain link
4 Chain pin
5 Substrate material
6 Intermediate layer
7 Surface layer

The invention claimed is:

1. A method for the production of a chain element formed from a substrate material containing carbon with a surface layer containing boron and vanadium, comprising the steps of:
   performing a first diffusion process of vanadium into areas of a substrate material containing carbon and forming a chain element, the areas are close to a surface thereof for constructing an intermediate layer containing carbon and vanadium and subsequently,
   performing a second diffusion process of boron into the intermediate layer, so that the intermediate layer is completely converted into a surface layer via formation of the surface layer containing the boron and the vanadium, such that the intermediate layer is no longer present, wherein the intermediate layer is formed with a thickness of 1-5 microns and the surface layer is formed with a thickness of 5-20 microns.

2. The method according to claim 1, further comprising performing a vanadizing process of the substrate material for the diffusion of the vanadium into areas of the substrate material close to the surface for the construction of the intermediate layer containing the carbon and the vanadium and performing a borizing process as the diffusion of the boron into the intermediate layer for the construction of the surface layer containing the boron and the vanadium.

3. The method according to claim 1, further comprising performing the diffusion of the vanadium into areas of the substrate material close to the surface for the construction of the intermediate layer containing carbon and the vanadium at a temperature range of 900-1300° C., and performing the diffusion of the boron into the intermediate layer for the construction of the surface layer containing the boron and the vanadium at a temperature range of 800-1100° C.

4. The method according to claim 1, further comprising performing the diffusion of the vanadium into areas of the substrate material close to the surface for the construction of the intermediate layer containing the carbon and the vanadium and the diffusion of the boron into the intermediate layer for the construction of the surface layer containing the boron and the vanadium for a duration of 1-24 hours.

5. A chain element, produced in accordance with the method according to claim 1.

6. A chain pin for connecting two chain links, produced in accordance with the method according to claim 1.

7. The method according to claim 1, wherein the first diffusion process includes chemically reacting a gaseous vanadium-chloride compound with the substrate material.

* * * * *